US012603630B2

(12) United States Patent
Shaw et al.

(10) Patent No.: US 12,603,630 B2
(45) Date of Patent: Apr. 14, 2026

(54) MATCH NETWORK WITH SWITCHABLE VARIABLE CAPACITANCE

(71) Applicant: Advanced Energy Industries, Inc., Denver, CO (US)

(72) Inventors: Denis Shaw, Fort Collins, CO (US); Masahiro Watanabe, Windsor, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 186 days.

(21) Appl. No.: 18/512,334

(22) Filed: Nov. 17, 2023

(65) Prior Publication Data

US 2025/0167748 A1 May 22, 2025

(51) Int. Cl.
| | |
|---|---|
| *H03H 7/01* | (2006.01) |
| *H03H 7/38* | (2006.01) |
| *H03H 7/40* | (2006.01) |
| *H03H 7/46* | (2006.01) |

(52) U.S. Cl.
CPC ............ *H03H 7/0115* (2013.01); *H03H 7/38* (2013.01); *H03H 7/40* (2013.01); *H03H 7/465* (2013.01); *H03H 2007/386* (2013.01)

(58) Field of Classification Search
CPC .......... H03H 7/40; H03H 7/0115; H03H 7/38; H03H 2007/386
USPC ........................ 333/17.3, 124, 171, 173, 175
See application file for complete search history.

(56) References Cited

U.S. PATENT DOCUMENTS

| | | | | |
|---|---|---|---|---|
| 7,212,960 | B2 * | 5/2007 | Quint .................... | G06F 30/367 |
| | | | | 333/117 |
| 8,743,575 | B2 | 6/2014 | Nymand | |
| 2015/0349750 | A1 | 12/2015 | Van et al. | |
| 2020/0066489 | A1 | 2/2020 | Lozic et al. | |
| 2022/0102116 | A1 | 3/2022 | Huh et al. | |
| 2022/0270856 | A1 | 8/2022 | Poulose et al. | |
| 2022/0384149 | A1 | 12/2022 | Shi et al. | |
| 2023/0050119 | A1 | 2/2023 | Martinez et al. | |

OTHER PUBLICATIONS

PCT, International Search Report and Written Opinion issued in PCT/US2024/054421, Dec. 30, 2024, 17 pages.

* cited by examiner

*Primary Examiner* — Rakesh B Patel
(74) *Attorney, Agent, or Firm* — NOD Law PC

(57) ABSTRACT

A match network with switchable variable capacitance. In one embodiment, a match network includes a first variable capacitance, a second variable capacitance, and a third variable capacitance dynamically connectable in parallel with the first variable capacitance. The match network also includes a controller configured to: control at least one of the first variable capacitance and the second variable capacitance for impedance tuning for a first power pulse; place, in response to a second power pulse, the third variable capacitance to be in parallel with the first variable capacitance; and control at least the third variable capacitance for impedance tuning for the second power pulse.

17 Claims, 10 Drawing Sheets

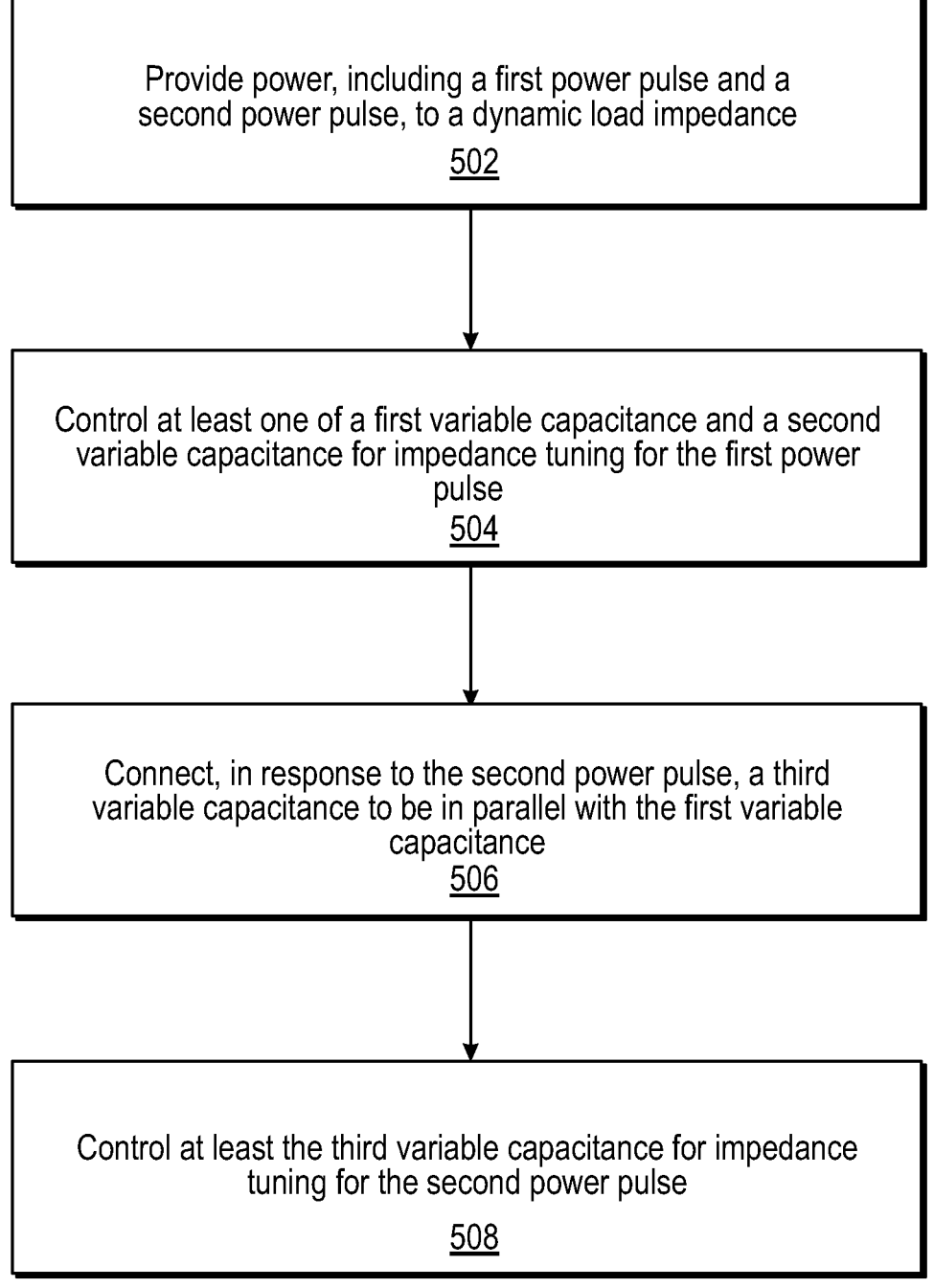

Provide power, including a first power pulse and a
second power pulse, to a dynamic load impedance
502

Control at least one of a first variable capacitance and a second
variable capacitance for impedance tuning for the first power
pulse
504

Connect, in response to the second power pulse, a third
variable capacitance to be in parallel with the first variable
capacitance
506

Control at least the third variable capacitance for impedance
tuning for the second power pulse
508

FIG. 5

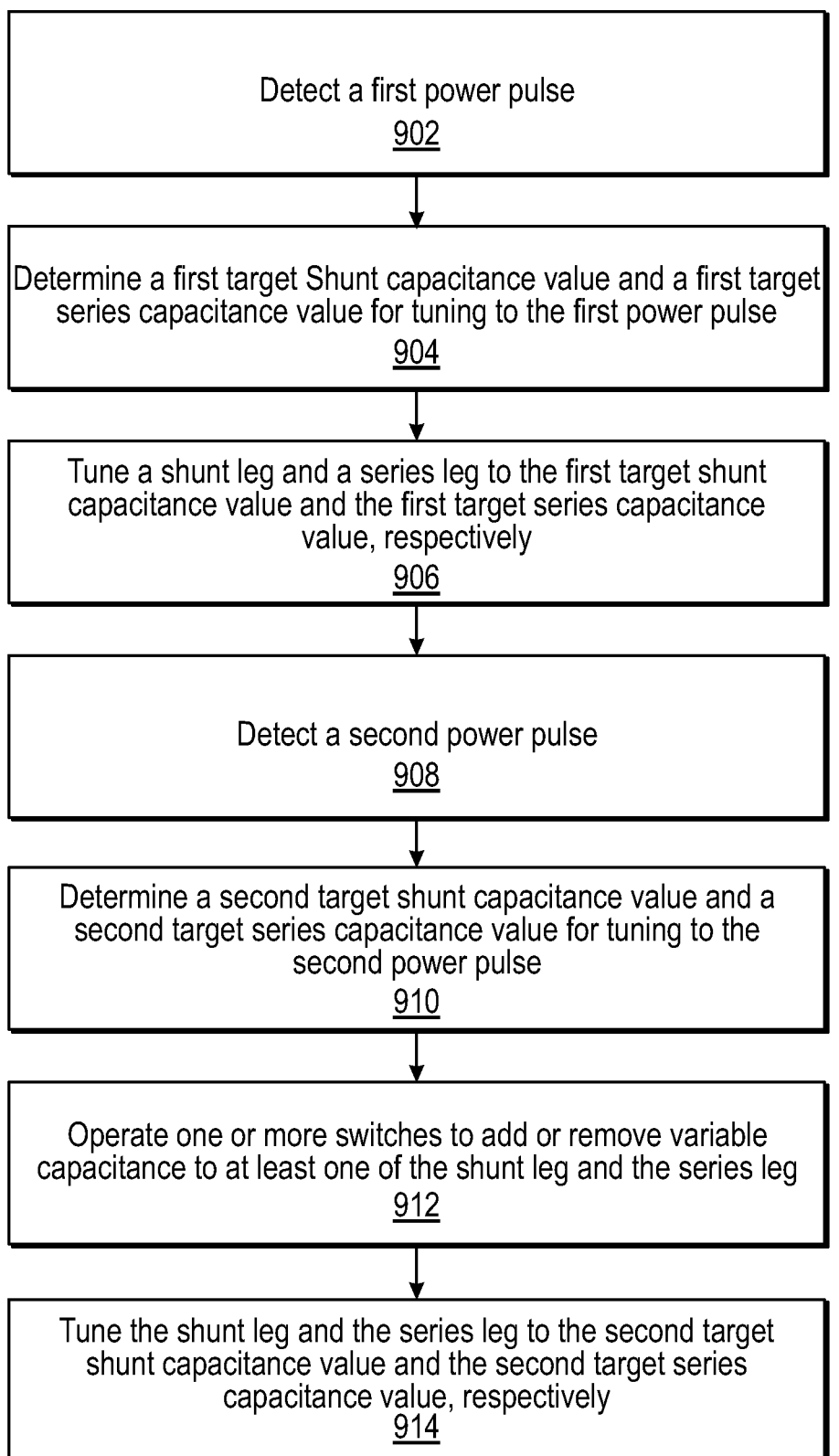

Detect a first power pulse
902

Determine a first target Shunt capacitance value and a first target series capacitance value for tuning to the first power pulse
904

Tune a shunt leg and a series leg to the first target shunt capacitance value and the first target series capacitance value, respectively
906

Detect a second power pulse
908

Determine a second target shunt capacitance value and a second target series capacitance value for tuning to the second power pulse
910

Operate one or more switches to add or remove variable capacitance to at least one of the shunt leg and the series leg
912

Tune the shunt leg and the series leg to the second target shunt capacitance value and the second target series capacitance value, respectively
914

FIG. 9

MATCH NETWORK WITH SWITCHABLE VARIABLE CAPACITANCE

BACKGROUND

Field

The present disclosure relates generally to plasma processing systems, and more specifically, to impedance matching in plasma processing systems.

Background

In plasma processing, a match network optimizes the power transfer between a generator and the plasma load. Modern plasma processing systems increasingly use multi-pulsed power for more advanced plasma control. However, multi-pulsing creates multiple impedance states, and conventional match network approaches are insufficient for impedance matching to the additional impedance states.

SUMMARY

According to an aspect, a match network comprises a first variable capacitance, a second variable capacitance, and a third variable capacitance dynamically connectable in parallel with the first variable capacitance. The match network also includes a controller configured to: control at least one of the first variable capacitance and the second variable capacitance for impedance tuning for a first power pulse; place, in response to a second power pulse, the third variable capacitance to be in parallel with the first variable capacitance; and control at least the third variable capacitance for impedance tuning for the second power pulse.

According to another aspect, a method is disclosed where the method includes providing power, including a first power pulse and a second power pulse, to a dynamic load impedance; controlling at least one of a first variable capacitance and a second variable capacitance for impedance tuning for the first power pulse; connecting, in response to the second power pulse, a third variable capacitance to be in parallel with the first variable capacitance; and controlling at least the third variable capacitance for impedance tuning for the second power pulse.

According to yet another aspect, a non-transitory processor-readable medium is disclosed that comprises instructions for execution by a processor or for configuring a field programmable gate array, the instructions comprising instructions to: control at least one of a first variable capacitance and a second variable capacitance for impedance tuning for a first power pulse; connect, in response to a second power pulse, a third variable capacitance to be in parallel with the first variable capacitance; and control at least the third variable capacitance for impedance tuning for the second power pulse.

BRIEF DESCRIPTION OF THE DRAWINGS

FIG. 5 is a flowchart illustrating a method of impedance tuning in an example embodiment.

FIG. 9 is a flowchart illustrating a method of impedance tuning in an example embodiment.

DETAILED DESCRIPTION

The following modes, features or aspects, given by way of example only, are described in order to provide a more precise understanding of the subject matter of several embodiments.

The word "exemplary" is used herein to mean "serving as an example, instance, or illustration." Any embodiment described herein as "exemplary" is not necessarily to be construed as preferred or advantageous over other embodiments.

Figure 1:
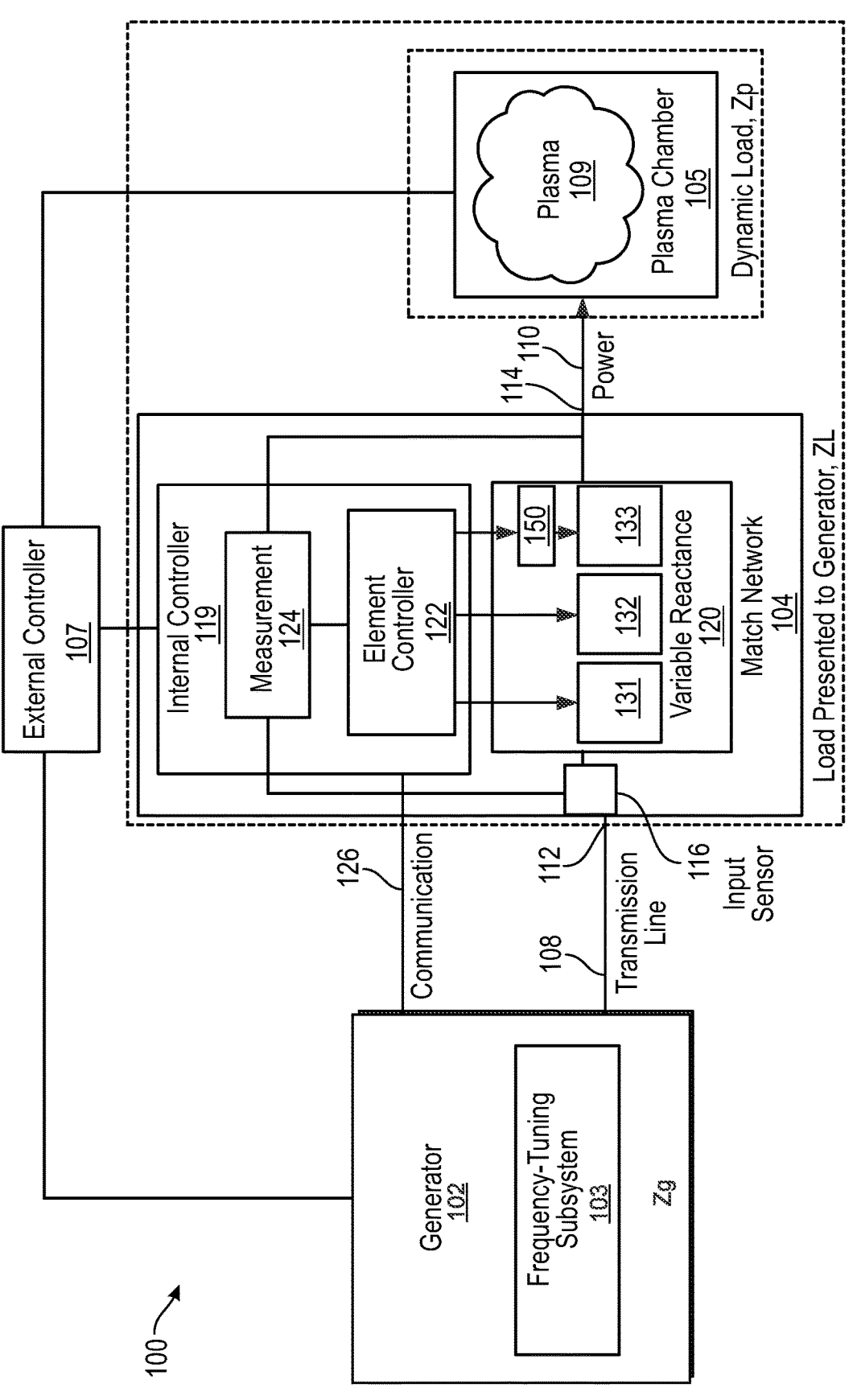
FIG. 1 is a block diagram of a plasma processing system in accordance with an embodiment of this disclosure.

FIG. 1 is a block diagram of a plasma processing system 100 in accordance with an embodiment of this disclosure. The plasma processing system 100 includes a generator 102, match network 104, a plasma chamber 105, and an external controller 107. In operation, the generator 102 applies power (e.g., medium frequency power, radio frequency (RF) power, or power at any frequency where impedance matching is beneficial) to the match network 104 via a transmission line 108 (e.g., coaxial cable) and then onto the plasma chamber 105 via an electrical connection 110. In one embodiment, the generator 102 includes a frequency-tuning subsystem 103 that is configured to adjust a frequency of the generator 102.

The match network 104 includes an input 112 including an electrical connector (not shown) to couple to the generator 102 via the transmission line 108 and an output 114 including an electrical connector (not shown) to couple to the plasma chamber 105 via the electrical connection 110. The match network 104 also includes an input sensor 116 coupled to an internal controller 119, which includes a measurement section 124, an element controller 122, and a variable reactance section 120. Moreover, as described in greater detail below, the variable reactance section 120 includes variable capacitances 131, 132, and 133.

In general, the match network 104 operates to achieve a complex conjugate match between the generator 102 and the plasma load. That is, the internal controller 119 controls the variable reactance section 120 such that the impedance presented to the generator 102 (i.e., presented to the transmission line 108 at an input 112 of the match network 104) is a complex conjugate of the impedance of the dynamic load, Zp. In doing so, the measurement section 124 may monitor the impedance of the plasma 109, and the element controller 122 uses this measurement feedback to generate control signals to tune the variable capacitances 131, 132, and 133 accordingly. The internal controller 119 thus continuously adapts the match network 104 such that impedance matching may occur under changing plasma conditions. This impedance matching helps achieve efficient power transfer, stable plasma conditions, and controlled processing outcomes.

The plasma processing system 100 is generally configured to use multi-pulsing as a technique to finely control the plasma environment. Multi-pulsing involves applying a sequence of pulses having different parameters, such as different power levels, frequencies, duration, or timing between pulses. Compared to continuous wave or single-pulse approaches, multi-pulsing enables increased dynamic control of the plasma environment by tailoring the pulse sequence and parameters to the process being performed, material properties, and desired effects.

Figure 2:
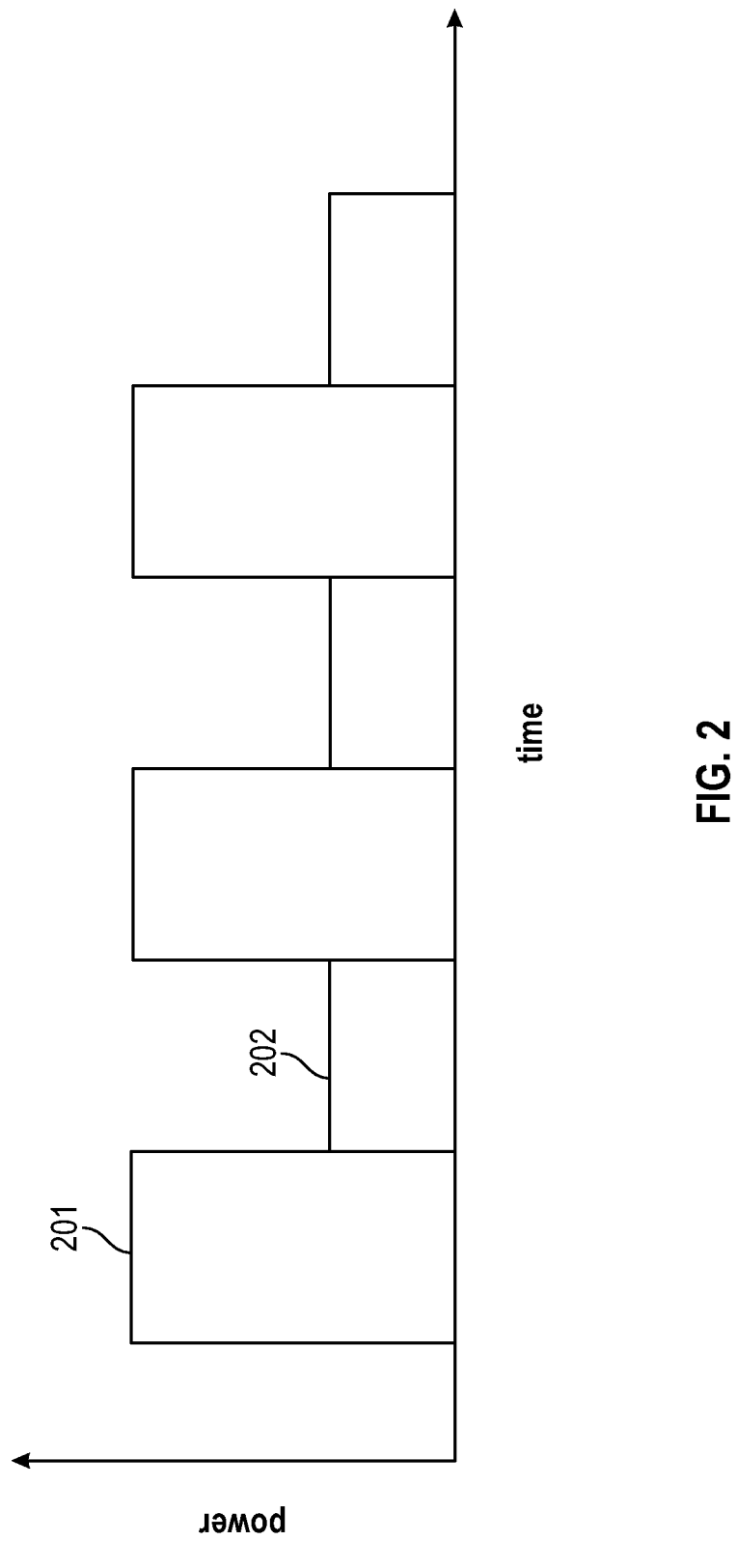
FIG. 2 is a graph depicting multi-pulsing in an example embodiment.

FIG. 2 is a graph depicting multi-pulsing in an example embodiment. In this example, the generator 102 applies dual-level pulsing to the plasma chamber 105 including a first power level 201 (e.g., high power state) and a second power level 202 (e.g., low power state) which alternate with one another in a repeating cycle over time. As mentioned, alternating between two or more states in this manner may produce several plasma processing benefits including increased control of plasma interaction with material. However, the use of two or more pulse states in plasma processing can make it difficult to achieve impedance matching. That is, as compared to single-pulse applications, multi-pulsing introduces an increased number of states for which impedance matching is to be performed.

Current approaches for match tuning dual-level pulsing typically involve using a match network to tune to one pulse state (e.g., first power level 201 or high power state) and using generator frequency tuning to try to match the remaining pulse state(s) (e.g., second power level 202 or low power state). This can result in reflected power during the remaining pulse states because frequency tuning is typically only able to compensate for the imaginary part of the plasma impedance. Reflected power can have negative effects on the efficiency and stability of the plasma process and is often unacceptable for plasma processing applications such as semiconductor manufacturing.

Returning to FIG. 1, to address the above-described issues, the match network 104 is enhanced to perform impedance matching for multiple pulsed states. In particular, in addition to a first variable capacitance 131 and a second variable capacitance 132 to tune to a first pulse state, the variable reactance section 120 includes at least one additional variable capacitance (e.g., a third variable capacitance 133) configured to be dynamically placed in parallel (e.g., via one or more solid-state switches 150) with at least one of the first/second variable capacitances 131/132 to tune to a second or additional pulse state. Advantageously, this may enable the match network 104 to achieve a true match for each individual pulse state such that reflect power is reduced and/or to tune to a desired impedance in a precisely controlled manner. Additionally, this may allow the number of solid-state switches in the match network 104 to be reduced, thus reducing power dissipation due to switching and increasing cooling of individual switches.

Figure 3:
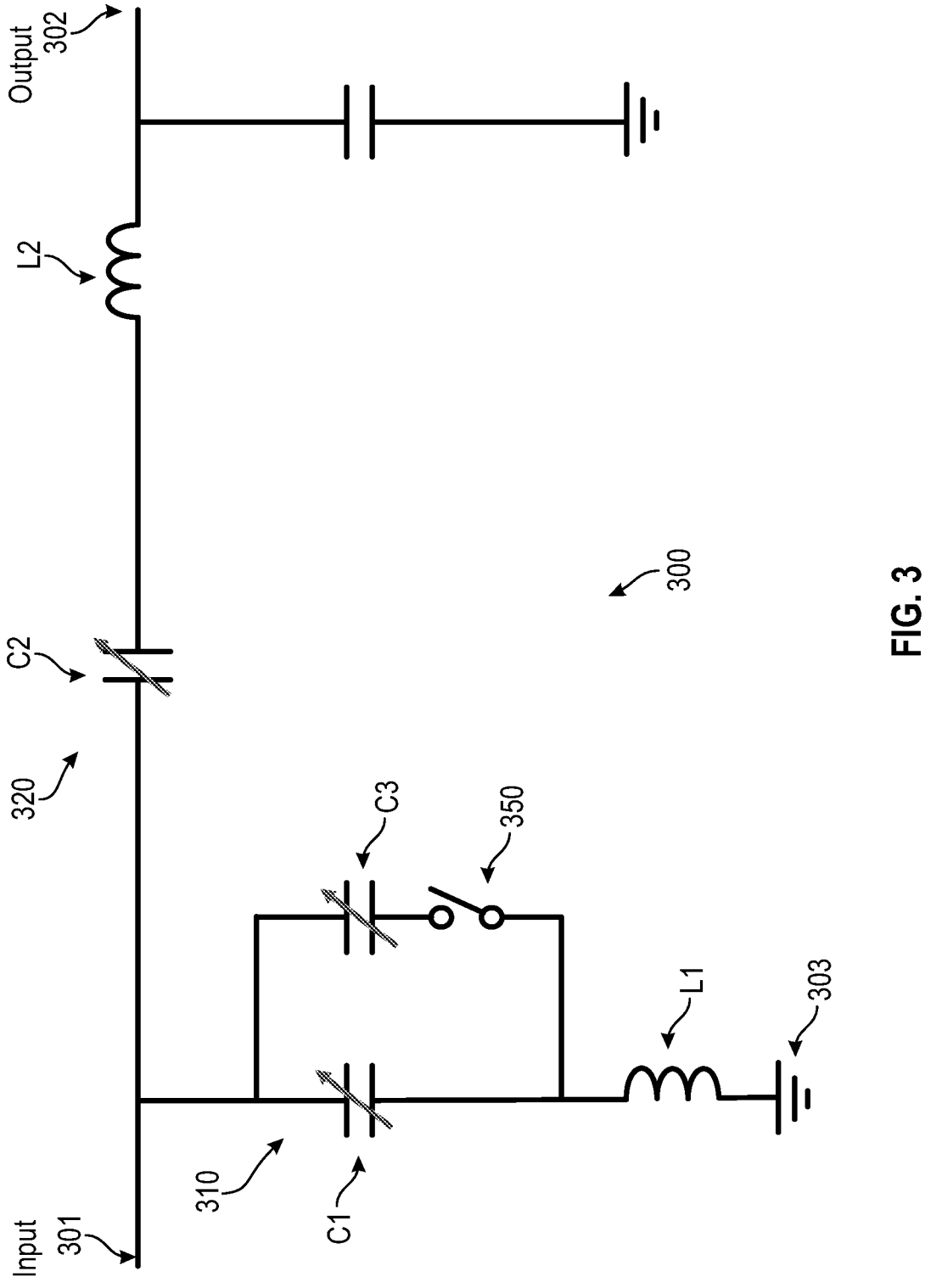
FIG. 3 shows a variable reactance section that is an example of the variable reactance section of FIG. 1.

FIG. 3 shows a variable reactance section 300 that is an example of the variable reactance section 120 of FIG. 1. In the variable reactance section 300, a first variable capacitance, C1, second variable capacitance, C2, and third variable capacitance, C3, are examples of the first variable capacitance 131, second variable capacitance 132, and third variable capacitance 133, respectively. The variable reactance section 300 is an example of an "L" match network topology including a shunt leg 310 (including C1 and inductive element L1 between input 301 and ground 303) and series leg 320 (including C2 and inductive element L2 between input 301 and output 302), although it will be appreciated that the concepts discussed herein are also applicable to other arrangements including "T" and "Pi" architectures.

In this example, C1 is a shunt element and C2 is a series element. C3 is an additional shunt element configured to be switched into parallel placement with C1 via one or more solid-state devices 350 (e.g., solid-state switches such as Field-Effect Transistors (FETs), Insulated Gate Bipolar Transistors (IGBTs), etc.). In one embodiment, variable capacitances C1, C2, and C3 each comprise one or more variable capacitors (e.g., variable vacuum capacitors and/or variable air capacitors). Variable capacitors may include moving parts, such as rotors and/or stators, that can be electronically or manually controlled to adjust capacitance. By contrast, solid-state capacitors may have a fixed and unchangeable capacitance value (e.g., having dielectric materials and metal plates and excluding adjustable or mechanical parts). Additionally, in some embodiments, each solid-state device 350 may comprise multiple switches in parallel or series to accommodate voltages of a match circuit.

Variable capacitances C1, C2, and C3 may be controlled so that the impedance as seen at the input 301 matches the load impedance at the output 302 for multiple power states. For example, for the first power level 201 (e.g., high power state), the element controller 122 (shown in FIG. 1) may adjust the capacitive values of C1 and C2 to obtain an impedance match while the solid-state device 350 is open and C3 is switched out of the circuit. To tune to the second power level 202 (e.g., low power state), the element controller 122 may close the solid-state device 350 to switch C3 into parallel arrangement with C1, and adjust C3 such that the sum of C1 and C3 obtains a best possible impedance match for the second state. Accordingly, the element controller 122 is configured to switch the solid-state device 350 open or closed depending on the pulse state, thus adding or removing C3 (e.g., one or more variable vacuum capacitors) depending on the pulse state. Additionally, when C3 is switched in or added to the circuit, the element controller 122 is configured to adjust the capacitive value of C3 to achieve the best tune for the additional pulse state.

In some embodiments, the match network 104 and/or variable reactance section 120 (e.g., variable reactance section 300 of FIG. 3) may function in connection with the frequency-tuning subsystem 103 to transform an impedance at the output 114 to a desired impedance value for the load, ZL (that is presented to the transmission line 108 at an input 112 of the match network 104). For instance, in the topology shown in FIGS. 3, C1 and C3 are part of the shunt leg 310 and their adjustment may primarily affect the real part of the impedance presented to the generator 102, while C2 is part of the series leg 320 and may primarily affect the imaginary part of the impedance presented to the generator 102. Here, to complete the process of impedance tuning for the second/additional pulse state, the frequency-tuning subsystem 103 may adjust the frequency of the generator 102 (i.e., perform frequency tuning) such that the imaginary part of the impedance is tuned along with the real part adjusted by C3.

Figure 4:
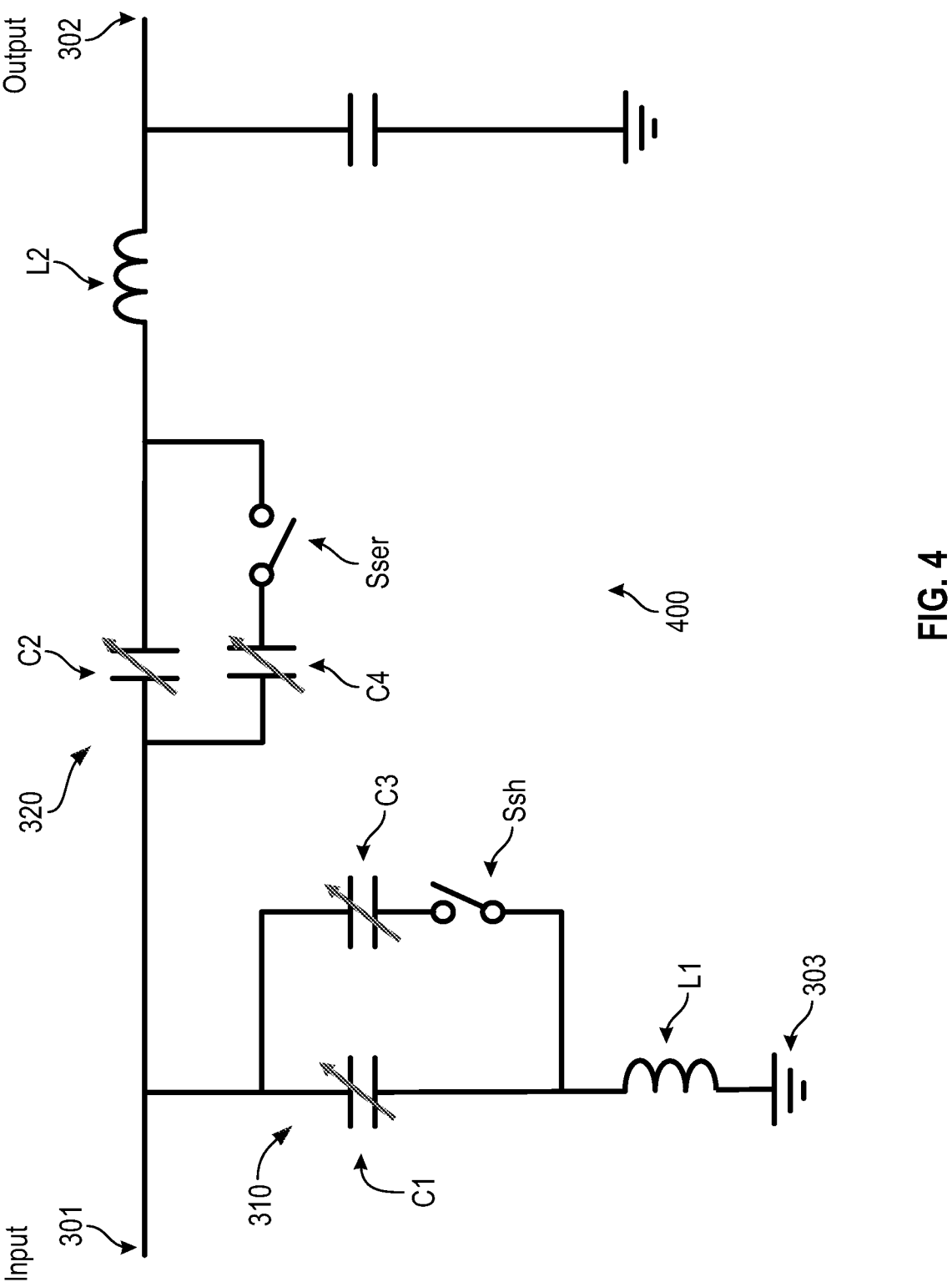
FIG. 4 shows a variable reactance section that is another example of the variable reactance section of FIG. 1.

FIG. 4 shows a variable reactance section 400 that is another example of the variable reactance section 120 of FIG. 1. The variable reactance section 400 has a similar configuration as the variable reactance section 300 described above. Here, however, the variable reactance section 400 includes two switched variable capacitances (e.g., one switched variable capacitance for each pulse state) to tune to multiple states without frequency tuning. In particular, C3 is configured for parallel placement with C1 via a shunt switch Ssh, and C4 is configured for parallel placement with C2 via a series switch Sser. The shunt switch Ssh and series switch Sser may comprise solid-state devices 350 previously discussed.

The element controller 122 is configured to control one or more of the shunt switch Ssh and the series switch Sser to adjust the capacitance, and therefore the impedance state, of the variable reactance section 400. That is, the element controller 122 is configured to control one or more of the shunt switch Ssh, the first variable capacitance C1, and the third variable capacitance C3 to tune a capacitance of the shunt leg 310. And, the element controller 122 is configured to control one or more of the series switch Sser, the second variable capacitance C2, and the fourth variable capacitance C4 to tune a capacitance of the series leg 320. Depending on tuning instructions, the element controller 122 may control the switches Ssh and Sser to operate in tandem or opposite to add or remove variable capacitance for the shunt leg 310 and series leg 320, respectively. Accordingly, the variable reactance section 400 is configured to tune to multiple pulses without frequency tuning.

Although FIGS. 3-4 are discussed with respect to a dual-pulsing example, it will be appreciated that the concepts are also applicable to embodiments with three or more multi-pulse states. That is, for each additional pulse state, one or two additional variable capacitances and associated switch(es) may be added. For example, for a third pulse state, the variable reactance section 400 may include a fifth variable capacitance configured to be placed in parallel with C3 and C1. The element controller 122 may close a solid-state device 350 to switch the fifth variable capacitance into parallel arrangement with C1 and adjust it such that the capacitance sum obtains a best possible impedance match for the third state. The imaginary portion of impedance for the third state may be completed with frequency tuning or a sixth variable capacitance configured to be placed in parallel with C4 and C2.

Additionally, as previously mentioned, alternative arrangements of the variable capacitances are contemplated. For example, a T-network match arrangement and Pi-network match arrangement may be configured to adjust impedance via elements corresponding with the shunt elements and series of elements described in FIGS. 3-4. In some arrangements, one element may be referred to as a load element (e.g., primarily tunes the real portion of impedance), and another element may be referred to as a tune element (e.g., primarily tunes the imaginary portion of impedance).

FIG. 5 is a flowchart illustrating a method of impedance tuning in an example embodiment. The steps of the method are described with reference to the plasma processing system 100 of FIG. 1, but those skilled in the art will appreciate that the method may be performed in other systems. The steps of the flowcharts described herein are not all inclusive, may include other steps not shown, and may be performed in an alternative order.

In step 502, the generator 102 provides power, including a first power pulse and a second power pulse, to a dynamic load impedance. In step 504, the element controller 122 controls at least one of a first variable capacitance 131 and a second variable capacitance 132 for impedance tuning for the first power pulse. In step 506, the element controller 122 connects, in response to the second power pulse, a third variable capacitance 133 to be in parallel with the first variable capacitance 131. In step 508, the element controller 122 controls at least the third variable capacitance 133 for impedance tuning for the second power pulse.

Example

Figure 6:
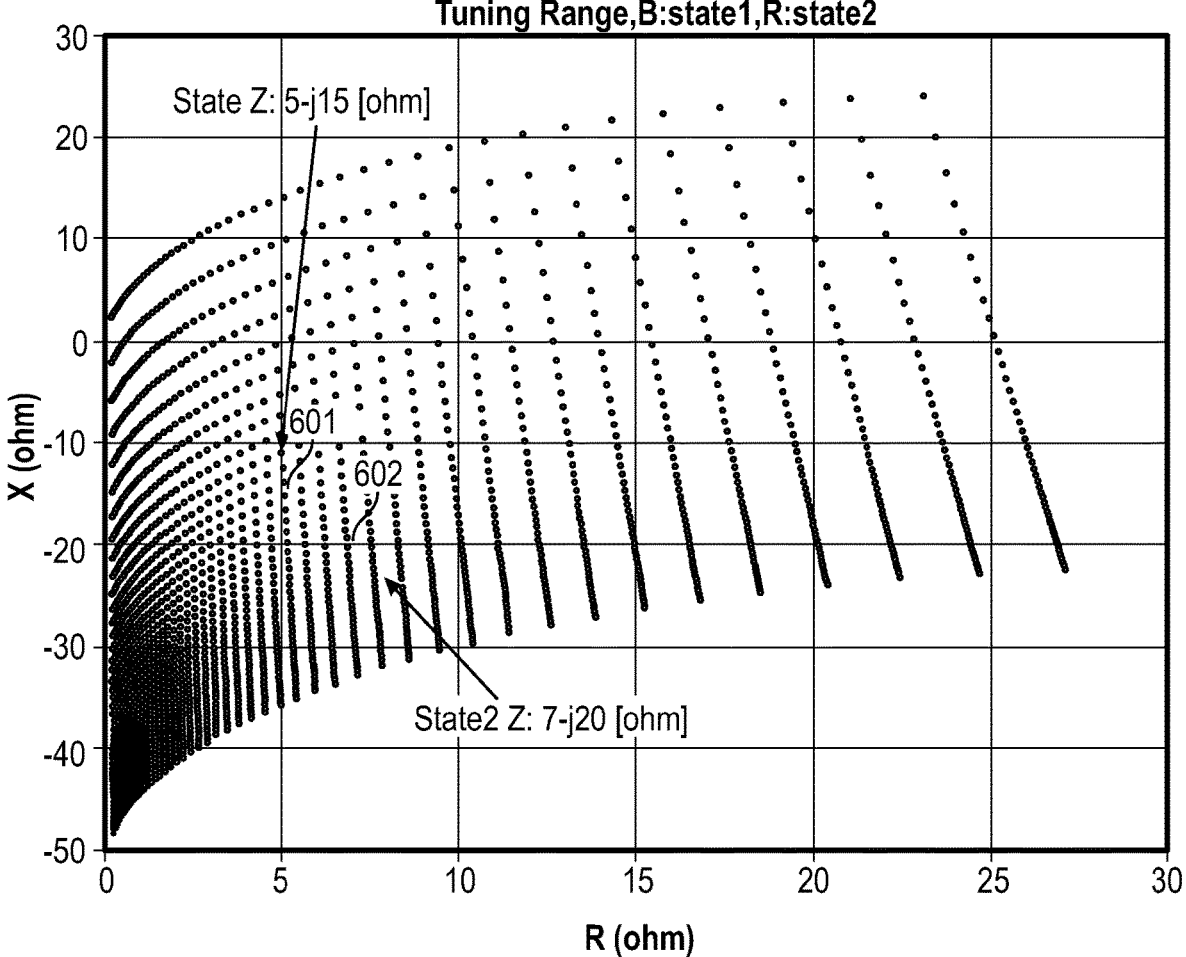
FIG. 6 is a graph depicting an example of load impedance of multiple power states.

FIGS. 6-8 show graphs depicting an impedance tuning example for multiple power states. For purposes of discussion, this example is discussed with respect to the variable reactance section 400 of FIG. 4 and plasma processing system 100 of FIG. 1, though it will be appreciated that the principles may apply to alternative variable reactance configurations, plasma processing systems, number of power states, etc. FIG. 6 is a graph depicting an example of load impedance of multiple power states. Some RF-related electrical parameters (e.g., voltage, current, and/or impedance) may be complex numbers represented in terms of a real part and an imaginary part. Impedance, Z, for example may be represented in terms of resistance "R" (real part) and reactance "X" (imaginary part): $Z=R+Xj$ where j is the square root of negative 1.

Suppose, for this example, that at an initial time before the match network 104 has begun tuning the variable reactance section 400, the load impedance for a first power state 601 (e.g., first pulse) is 5-j15 ohms, and the load impedance for a second power state 602 (e.g., second pulse) is 7-j20 ohms. Assume further for this example that the generator 102 is designed for an optimum operation when 50 ohms is presented to the generator 102. To provide an efficient pathway for power transfer, the match network 104 operates to tune the variable reactance section 400 to transform the impedance presented to the generator 102 to 50 ohms. The impedance presented to the generator 102 by the load, ZL, may include the plasma 109 itself, components associated with a plasma chamber 105, and the variable reactance section 400 of the match network 104.

For example, for the first power state 601, the element controller 122 may control the shunt leg 310 (e.g., shunt switch Ssh, first variable capacitance C1, or a combination of first variable capacitance C1 and third variable capacitance C3) and the series leg 320 (e.g., series switch Sser, second variable capacitance C2, or a combination of second variable capacitance C2 and fourth variable capacitance C4), where a unique combination of shunt capacitance (C1 or a combination of C1 and C3) and series capacitance (C1 or a combination of C1 and C3) transforms the load impedance for the first power state to 50 ohms presented to the generator. Then, for the second power state 602, the element controller 122 may toggle a switch (e.g., series switch Sser and/or shunt switch Ssh) to either add or remove a variable capacitance for the series leg 320 and/or shunt leg 310 depending on whether more or less capacitance is needed for each leg. Additional details of the example are discussed below.

Figure 7A:
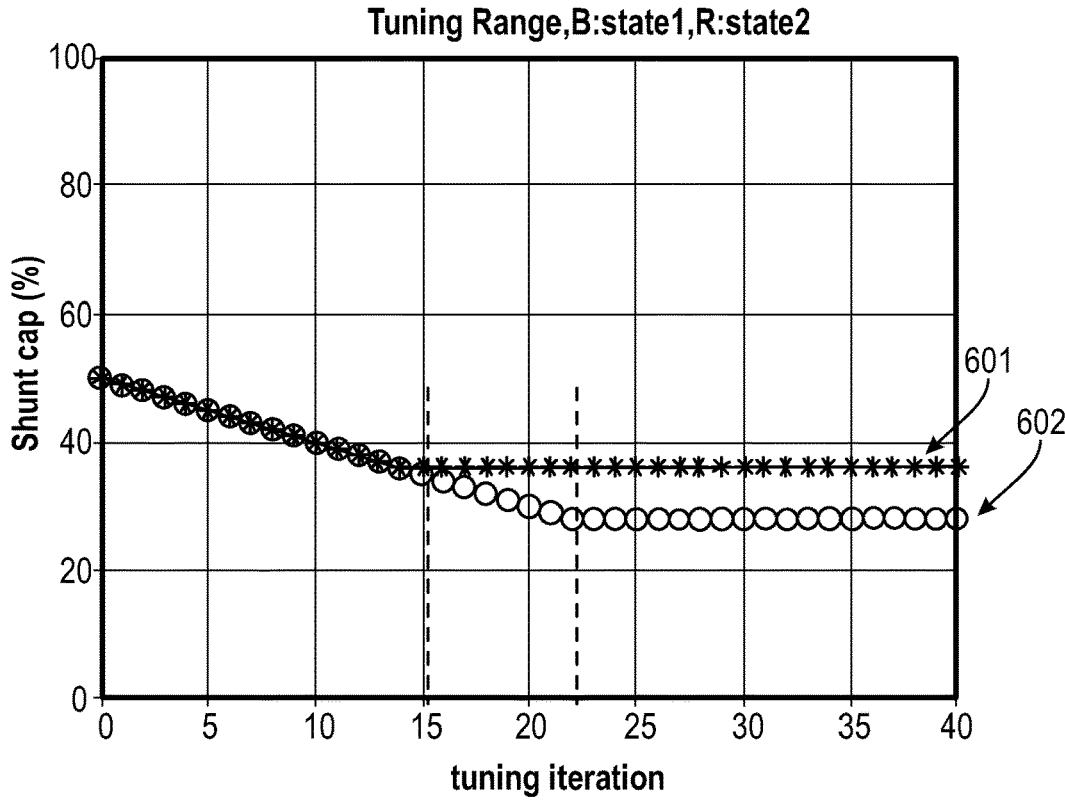
FIG. 7A is a graph depicting an example of adjusting shunt capacitance for impedance tuning for multiple power states.

FIG. 7A is a graph depicting an example of adjusting shunt capacitance for impedance tuning for multiple power states. In particular, the element controller 122 adjusts shunt capacitance for a first power state 601 and a second power state 602 corresponding with the load impedances of 5-j15 ohms and 7-j20 ohms, respectively. To begin the process of impedance matching by tuning the shunt leg 310, the element controller 122 determines to decrease shunt capacitance from its initial position of approximately 50% of its maximum capacitive value, thus partly decreasing the absolute value of reflection coefficient presented to the generator 102.

More particularly, with reference to the example variable reactance section 400 of FIG. 4, the element controller 122 may determine to connect the third variable capacitance, C3, for impedance tuning for the first power state 601, and disconnect C3 for impedance tuning for the second power state 602. That is, the shunt capacitance for the first power state 601 is based on a capacitive sum of C3 and C1, and the shunt capacitance for the second power state 602 is based on a capacitive value of C1 without C3.

After decreasing shunt capacitance for fifteen tuning iterations in which the first power state 601 and the second power state alternate, an impedance match of the first power state 601 is reached with the shunt capacitance at approximately 38% of maximum capacitance. In subsequent tuning iterations, the element controller 122 maintains the shunt capacitance value for the first power state 601 (capacitive sum of C1 and C3), and continues to decrease the first variable capacitance C1 for the second power state 602 until tuning iteration twenty-two, where an impedance match of the second power state 602 is reached with the shunt capacitance at approximately 28% of maximum capacitance. Thereafter, for optimum load impedance presented to the generator 102, the element controller 122 may toggle the shunt switch Ssh with the alternating power states such that the shunt capacitance is approximately 38% of maximum capacitance for the first power state 601 and approximately 28% of maximum capacitance for the second power state 602.

Figure 7B:
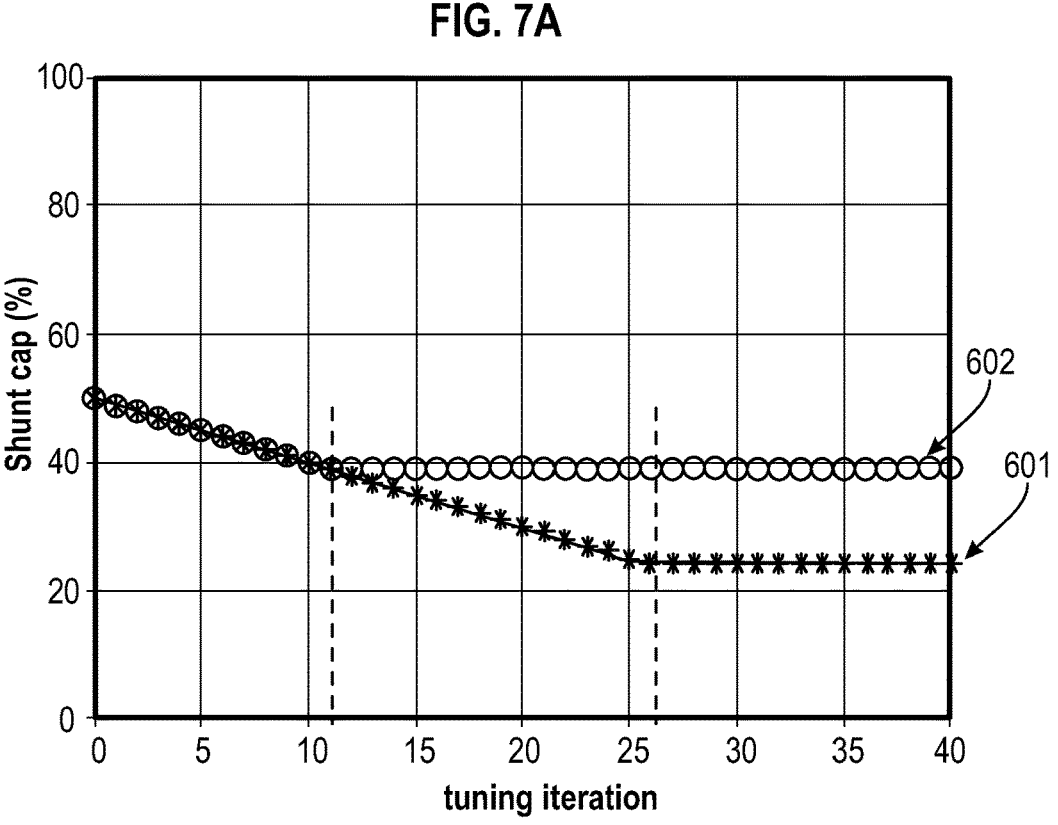
FIG. 7B is a graph depicting an example of adjusting series capacitance for impedance tuning for multiple power states.

FIG. 7B is a graph depicting an example of adjusting series capacitance for impedance tuning for multiple power states. Here, the element controller 122 adjusts series capacitance for a first power state 601 and a second power state 602 corresponding with the load impedances of 5-j15 ohms and 7-j20 ohms, respectively. To begin the process of impedance matching by tuning the series leg 320, the element controller 122 determines to decrease series capacitance from its initial position of approximately 50% of its maximum capacitive value (e.g., to provide more negative reactance to partially offset the imaginary part of the load impedances).

More particularly, the element controller 122 may determine to connect the fourth variable capacitance, C4, for impedance tuning for the second power state 602, and disconnect C4 for impedance tuning for the first power state 601. That is, the series capacitance for the second power state 602 is based on a capacitive sum of C2 and C4, and the series capacitance for the first power state 601 is based on a capacitive value of C2 without C4.

After decreasing series capacitance for eleven tuning iterations in which the first power state 601 and the second power state alternate, an impedance match of the second power state 602 is reached with the series capacitance at approximately 40% of maximum capacitance. In subsequent tuning iterations, the element controller 122 maintains the series capacitance value for the second power state 602, and continues to decrease the second variable capacitance C2 for the first power state 601 until tuning iteration twenty-six, where an impedance match of the first power state 601 is reached with the series capacitance at approximately 22% of maximum capacitance. Thereafter, for optimum load impedance presented to the generator 102, the element controller 122 may toggle the series switch Sser with the alternating power states such that the series capacitance is approximately 40% of maximum capacitance for the second power state 602 and approximately 22% of maximum capacitance for the first power state 601.

Figure 8A:
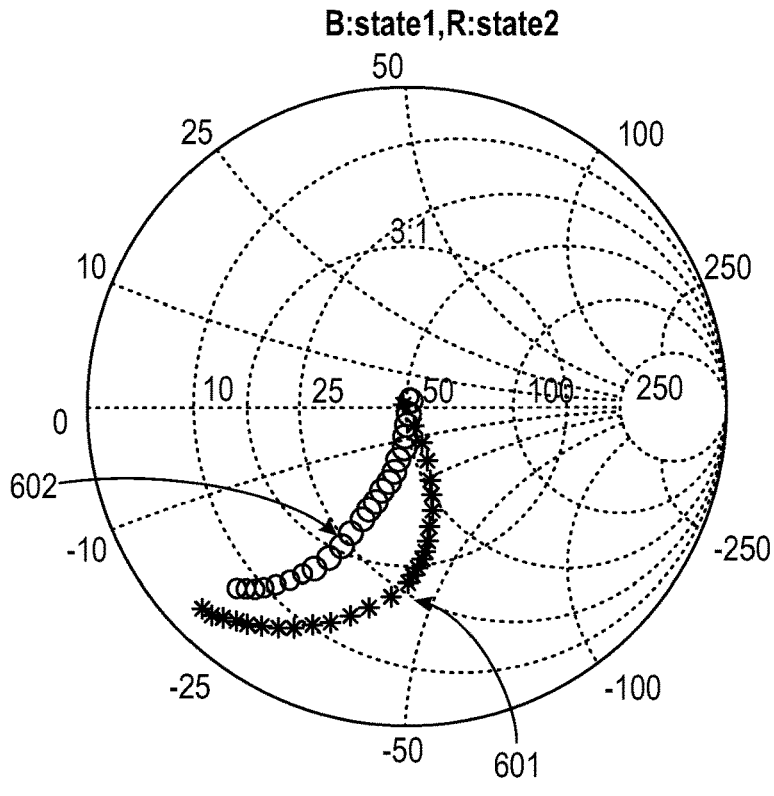
FIG. 8A is a Smith chart showing an example of impedance value presented to the generator for multiple power states.

FIG. 8A is a Smith chart showing an example of impedance value presented to the generator 102 for multiple power states. In particular, each point represents a specific impedance value with both real and imaginary components for each of the first power state 601 and second power state 602. As the element controller 122 performs the above-described variable capacitance tuning and switching for the shunt and series legs, the impedance values for each power state trends toward 50 ohms. Although 50 ohms is a common characteristic impedance of a generator, those of ordinary skill in the art of plasma processing systems will appreciate that, depending upon the particular type (e.g., design architecture, make, and/or model) of generator used to realize the generator 102, the source impedance, Zg, of the generator 102 may differ from 50 ohms and/or the desired impedance may differ from 50 ohms for other reasons.

Figure 8B:
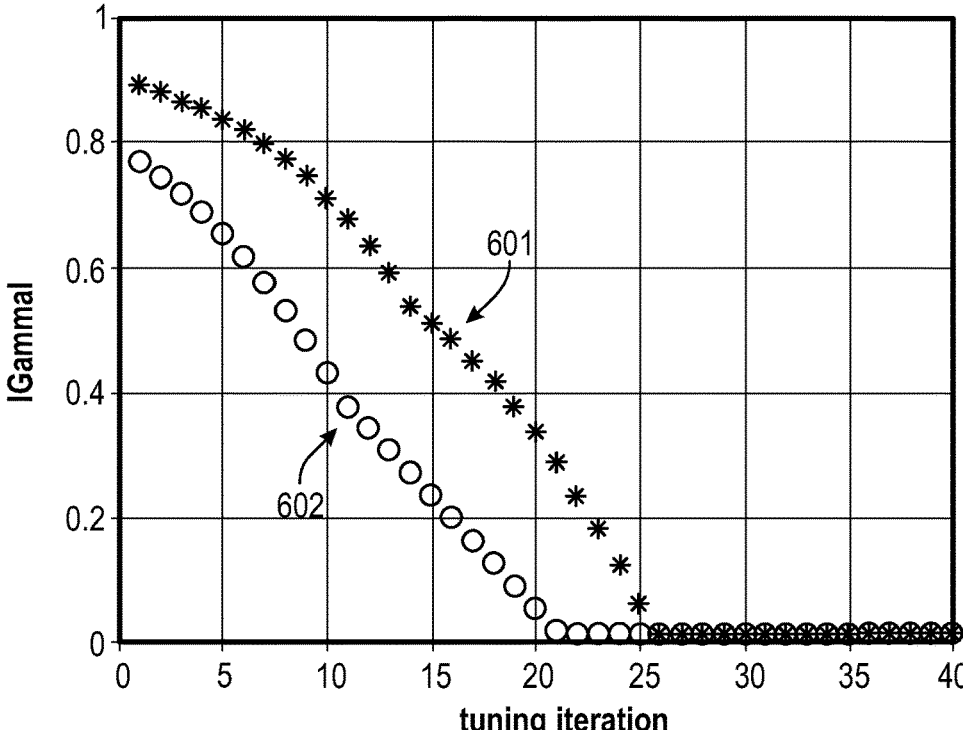
FIG. 8B is a graph showing an example of absolute value of reflection coefficient changes over successive tuning iterations for multiple power states.

FIG. 8B is a graph showing an example of absolute value of reflection coefficient changes over successive tuning iterations for multiple power states. The reflection coefficient, or gamma, quantifies the amount of power that is reflected during operation. As the element controller 122 performs the above-described variable capacitance tuning and switching for the shunt and series legs, absolute value of the reflection coefficient reduces over time, indicating improvement of matching the impedance load to the tuned state as the matching network 104 is adjusted through various iterations.

FIG. 9 is a flowchart illustrating a method of impedance tuning in an example embodiment. The steps of the method are described with reference to the plasma processing system 100 of FIG. 1 and variable reactance section 400 of FIG. 4, but those skilled in the art will appreciate that the method may be performed in other systems and match topologies. The steps of the flowcharts described herein are not all inclusive, may include other steps not shown, and may be performed in an alternative order.

In step 902, the match network 104 detects a first power pulse. In step 904, the internal controller 119 determines a first target shunt capacitance value and a first target series capacitance value for tuning to the first power pulse. In step 906, the element controller 122 tunes the shunt leg 310 and the series leg 320 to the first target shunt capacitance value and the first target series capacitance value, respectively. In step 908, the match network 104 detects a second power pulse. In step 910, the internal controller 119 determines a second target shunt capacitance value and a second target series capacitance value for tuning to the second power pulse. In step 912, the element controller 122 operates one or more switches to add or remove variable capacitance to at least one of the shunt leg 310 and the series leg 320. And, in step 914, the element controller 122 tunes the shunt leg 310 and the series leg 320 to the second target shunt capacitance value and the second target series capacitance value, respectively.

Steps 902-914 may repeat for continuous adjustment of capacitance values to efficiently transfer multi-pulsed power and continuous adaptation to changing load conditions. The determination of target capacitance values for each leg may be based on real-time measurement feedback on the impedance of the load. The internal controller 119 may also determine whether to add or remove variable capacitance for each leg based at least in part on an initial or current variable capacitance position and determined direction of tuning (e.g., increasing or decreasing capacitance). For example, the internal controller 119 may assign one variable capacitance to a first power pulse and assign the one variable capacitance and a parallel variable capacitance to a second power pulse based on the load impedance differences for the power pulses, the initial capacitor positions, and the determined direction of tuning.

Although not shown to keep the depiction of FIG. 1 simple and clear, one of ordinary skill in the art will readily appreciate that the generator 102, the match network 104, and/or the external controller 107 may include a user interface to enable an operator of the plasma processing system 100 to control and monitor the plasma processing system 100. It should also be noted that the depiction of the external controller 107 should not be construed to mean that common supervisory control over the generator 102 and match network 104 is required.

The plasma 109 may be a plasma formed in the plasma chamber 105, which is known for performing processing such as the etching of substrates or the deposition of thin layers upon substrates. The plasma 109 is typically achieved by the formation of plasmas within low pressure gases. The plasma is initiated and sustained by the generator 102 (and potentially additional generators). The generator 102 may apply power to the plasma chamber 105 by a conventional 13.56 MHz signal, but other frequencies may also be utilized.

The external controller 107 may be realized by hardware or hardware in connection with software, and the external controller 107 may be coupled to several components of a plasma processing system 100 including the generator 102, match network 104, equipment coupled to the plasma chamber 105, other generators, mass flow controllers, etc. The input sensor 116 may be realized by a conventional dual directional coupler (known to those of ordinary skill in the art) that includes sensing circuitry that provides outputs indicative of forward and reflected power at the input of the match network 104. The input sensor 116 may also be realized by a conventional voltage-current (V/I) sensor (known to those of ordinary skill in the art) that includes sensing circuitry that provides outputs indicative of voltage, current, and a phase between the voltage and current. As a nonlimiting example, a directional coupler may be used to realize the input sensor 116. The input sensor 116 may also comprise a frequency sensor known to those of ordinary skill in the art. Moreover, the input sensor 116 may be realized by more than one separate sensors (e.g., a separate voltage sensor and a separate current transducer). In other words, although a single block is depicted for each of the input sensor 116, the block may represent one or more sensors (and potentially processing circuitry).

The measurement section 124 may include processing components to sample, filter, and digitize the outputs of the input sensor 116 for utilization by the element controller 122. Because an impedance of the load, ZL tends to vary during processing of a workpiece (e.g., a substrate), the element controller 122 may operate on an ongoing basis to adjust the variable reactance section 120 to change its impedance to compensate for fluctuations in the impedance of the dynamic load.

In some variations, a communication link 126 communicatively couples the generator 102 and the match network 104 to enable informational and/or control signals to be sent between the generator 102 and the match network 104. But many implementations do not require the communication link 126, and it should be recognized that in these implementations the match network 104 may operate substantially independent of the generator 102. The specific embodiment of the match network 104 in FIG. 1 (in which the element controller 122 and the measurement section 124 are within the internal controller 119 of the match network 104) may be beneficial for one or more reasons. For example, the internal controller 119 of the match network 104 may have access to internal parameters of the match network 104 that the external controller 107 (or other external controllers) does not have access to. As another example, the internal controller 119 is in closer proximity to the input sensor 116; thus, data from the sensor 116 may be received and processed relatively quickly. In addition, the components of the internal controller 119 may be realized on the same printed circuit board or even the same chip (as a system on a chip); thus, very fast bus communications (without the need to translate to another communication protocol, such as a local area network protocol) may be carried out between the components of some embodiments of the internal controller 119.

But in variations of the embodiment depicted in FIG. 1, it may be beneficial to distribute one or more of the components of the match network 104 and/or generator 102, so other configurations are certainly contemplated. For example, the input sensor 116 may be located outside of the match network 104. As another example, the input sensor 116 may reside within the generator 102 and the generator 102 may provide a signal indicative of electrical parameters at the output of the generator 102 to the measurement section 124. Moreover, one or more of the components of the internal controller 119 (e.g., one or more of the element controller 122 and measurement section 124 may be located apart from the match network 104). For example, it is contemplated that one or more components of the internal controller 119 may be located remotely from the match network 104 and may be coupled to the match network 104, the generator 102, or the external controller 107 by a network connection. It is also contemplated that the frequency-tuning subsystem 103 may be realized, at least in part in the external controller 107. In many instances, operators of plasma processing systems (such as the system depicted in FIG. 1) may prefer to utilize a centralized controller (such as the external controller 107) for convenience, and because the operators may prefer to have control over the logic and algorithms that are utilized in the generator 102 and/or match network 104.

By way of further example, it should also be recognized that the components of the match network 104 are depicted as logical components and that the depicted components may be realized by common constructs (e.g., a common central processing unit and non-volatile memory) that are closely integrated, or the depicted components may be further distributed. For example, the functionality of the measurement section 124 may be distributed with the input sensor 116 so that signals output from the input sensor 116 are digital signals that have been processed and digitalized, which enables the element controller 122 to directly receive processed signals from the input sensor 116. The specific examples of the distribution of the depicted functions are not intended to be limiting because it is certainly contemplated that various alternatives may be utilized depending upon the type of hardware that is selected and the extent to which software (e.g., embedded software) is utilized.

The element controller 122 may be configured to obtain an input impedance at the input of the match network 104. The input impedance is also referred to herein as a value of the impedance of the load, ZL, presented to the generator 102. As those of ordinary skill in the art will appreciate, the input sensor 116 may provide the necessary measurements of power-related parameters such as voltage, current, phase between the voltage and current, forward power, and reflected power, which may be used to calculate input impedance.

Figure 10:
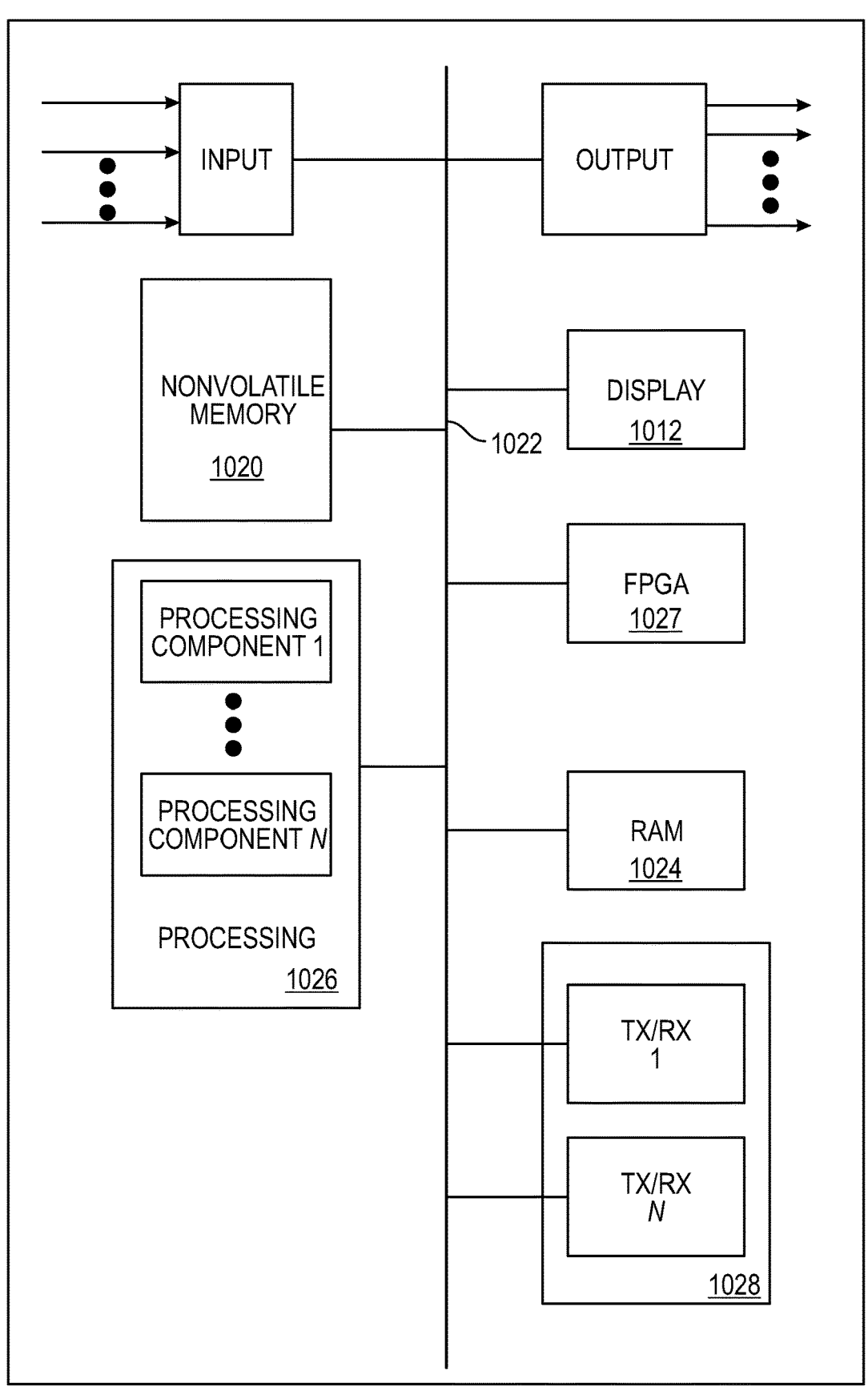
FIG. 10 is a block diagram depicting physical components that may be used to implement an element controller in accordance with an embodiment of this disclosure.

The methods described in connection with the embodiments disclosed herein may be embodied directly in hardware, in processor executable instructions encoded in non-transitory machine readable medium, or as a combination of the two. Referring to FIG. 10 for example, shown is a block diagram depicting physical components that may be utilized to realize one or more of the frequency-tuning subsystem 103, external controller 107, and/or internal controller 119. As shown, in this embodiment a display portion 1012 and nonvolatile memory 1020 are coupled to a bus 1022 that is also coupled to random access memory ("RAM") 1024, a processing portion (which includes N processing components) 1026, a field programmable gate array (FPGA) 1027, and a transceiver component 1028 that includes N transceivers. Although the components depicted in FIG. 10 represent physical components, FIG. 10 is not intended to be a detailed hardware diagram; thus, many of the components depicted in FIG. 10 may be realized by common constructs or distributed among additional physical components. Moreover, it is contemplated that other existing and yet-to-be developed physical components and architectures may be utilized to implement the functional components described with reference to FIG. 10.

Display portion 1012 generally operates to provide a user interface for a user, and in several implementations, the display is realized by a touchscreen display. For example, display portion 1012 can be used to control and interact with internal controller 119 in connection with characterizing a dynamic load to produce an associated impedance trajectory. The user interface may also be used to enable an operator to select particular power levels, frequencies, and pulse parameters for the generator 102. In general, the nonvolatile memory 1020 is non-transitory memory that functions to store (e.g., persistently store) data and machine readable (e.g., processor readable and executable) code (including executable code that is associated with effectuating the methods described herein). In some embodiments, for example, the nonvolatile memory 1020 includes bootloader code, operating system code, file system code, and non-transitory processor-executable code to facilitate the execution of the methods (e.g., the methods described with reference to FIG. 5 and/or FIG. 9) described herein.

In many implementations, the nonvolatile memory 1020 is realized by flash memory (e.g., NAND or ONENAND memory), but it is contemplated that other memory types may be utilized as well. Although it may be possible to execute the code from the nonvolatile memory 1020, the executable code in the nonvolatile memory is typically loaded into RAM 1024 and executed by one or more of the N processing components in the processing portion 1026.

In operation, the N processing components in connection with RAM 1024 may generally operate to execute the instructions stored in nonvolatile memory 1020 to realize the functionality of frequency-tuning subsystem 103 and element controller 122. For example, non-transitory processor-executable instructions to effectuate the methods described herein may be persistently stored in nonvolatile memory 1020 and executed by the N processing components in connection with RAM 1024. As one of ordinary skill in the art will appreciate, the processing portion 1026 may include a video processor, digital signal processor (DSP), graphics processing unit (GPU), and other processing components.

In addition, or in the alternative, the field programmable gate array (FPGA) 1027 may be configured to effectuate one or more aspects of the methodologies described herein (e.g., the methods described with reference to FIG. 5 and/or FIG. 9). For example, non-transitory FPGA-configuration-instructions may be persistently stored in nonvolatile memory 1020 and accessed by the FPGA 1027 (e.g., during boot up) to configure the FPGA 1027 to effectuate the functions of frequency-tuning subsystem 103 and element controller 122.

The input component may operate to receive signals (e.g., from sensor 116) that are indicative of one or more properties of the power that is output by the generator 102 and that characterize the dynamic load, Zp. The signals received at the input component may include, for example, voltage, current, forward power, reflected power, and dynamic load impedance. The output component generally operates to provide one or more analog or digital signals to effectuate an operational aspect of the match network 104 and/or generator 102. For example, the output portion may transmit the adjusted frequency to an exciter of the generator 102 during frequency tuning. The output may also be used to control elements described herein including positions of the first variable capacitance 131, second variable capacitance 132, third variable capacitance 133, etc.

The depicted transceiver component 1028 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A match network comprising:
a first variable capacitance that is part of a shunt leg;
a second variable capacitance that is part of a series leg;
a third variable capacitance that is part of the shunt leg and is switchably connectable in parallel with the first variable capacitance via a first solid-state switch; and
a controller configured to:
control at least one of the first variable capacitance and the second variable capacitance for impedance tuning for a first power pulse;
place, in response to a second power pulse, the third variable capacitance to be in parallel with the first variable capacitance; and
control at least the third variable capacitance for impedance tuning for the second power pulse.

2. The match network of claim 1, wherein:
the controller is configured, during the first power pulse, to disconnect the third variable capacitance, and to control the first variable capacitance and the second variable capacitance to match a load impedance to a source impedance for the first power pulse; and
the controller is configured, during the second power pulse, to connect the third variable capacitance, and to control a sum of the first variable capacitance and the third variable capacitance for the impedance tuning for the second power pulse.

3. The match network of claim 2, wherein:

the impedance tuning for the second power pulse is completed via frequency tuning.

4. The match network of claim 1, further comprising:

a fourth variable capacitance dynamically connectable in parallel with the second variable capacitance via a second solid-state switch;

wherein the controller is configured to control one or more of the first solid-state switch, the first variable capacitance, and the third variable capacitance to tune a capacitance of the shunt leg; and wherein the controller is configured to control one or more of the second solid-state switch, the second variable capacitance, and the fourth variable capacitance to tune a capacitance of the series leg.

5. The match network of claim 4, wherein:

the first variable capacitance, the second variable capacitance, the third variable capacitance, and the fourth variable capacitance each comprise a variable vacuum capacitance.

6. The match network of claim 4, wherein:

the controller is configured to determine a first target shunt capacitance value and a first target series capacitance value for impedance matching for the first power pulse;

the controller is configured to determine a second target shunt capacitance value and a second target series capacitance value for impedance matching for the second power pulse;

the controller is configured to control the first solid-state switch to switch between the first target shunt capacitance value and the second target shunt capacitance value; and the controller is configured to control the second solid-state switch to switch between the first target series capacitance value and the second target series capacitance value.

7. A method comprising:

providing power, including a first power pulse and a second power pulse, to a dynamic load impedance;

controlling at least one of a first variable capacitance and a second variable capacitance for impedance tuning for the first power pulse;

connecting, in response to the second power pulse, a third variable capacitance to be in parallel with the first variable capacitance, wherein the third variable capacitance is switchably connectable in parallel with the first variable capacitance via a first solid-state switch;

controlling at least the third variable capacitance for impedance tuning for the second power pulse; wherein:

the first variable capacitance is part of a shunt leg;

the second variable capacitance is part of a series leg; and the third variable capacitance is part of the shunt leg.

8. The method of claim 7, further comprising:

controlling one or more of the first solid-state switch, the first variable capacitance, and the third variable capacitance to tune a capacitance of the shunt leg; and controlling one or more of a second solid-state switch, the second variable capacitance, and a fourth variable capacitance to tune a capacitance of the series leg, wherein the fourth variable capacitance is part of the series leg and is switchably connectable in parallel with the second variable capacitance via the second solid-state switch.

9. The method of claim 8, wherein:

the first variable capacitance, the second variable capacitance, the third variable capacitance, and the fourth variable capacitance each comprise a variable vacuum capacitance.

10. The method of claim 7, further comprising:

during the first power pulse, disconnecting the third variable capacitance, and controlling the first variable capacitance and the second variable capacitance to match the dynamic load impedance to a source impedance for the first power pulse; and during the second power pulse, connecting the third variable capacitance, and controlling a sum of the first variable capacitance and the third variable capacitance for the impedance tuning for the second power pulse.

11. The method of claim 10, further comprising:

performing frequency tuning during the second power pulse to complete the impedance tuning for the second power pulse.

12. A non-transitory processor-readable medium comprising instructions for execution by a processor or for configuring a field programmable gate array, the instructions comprising instructions to:

control at least one of a first variable capacitance and a second variable capacitance for impedance tuning for a first power pulse;

connect, in response to a second power pulse, a third variable capacitance to be in parallel with the first variable capacitance, wherein the third variable capacitance is switchably connectable in parallel with the first variable capacitance via a first solid-state switch;

control at least the third variable capacitance for impedance tuning for the second power pulse; wherein:

the first variable capacitance is part of a shunt leg;

the second variable capacitance is part of a series leg; and the third variable capacitance is part of the shunt leg.

13. The non-transitory processor-readable medium of claim 12, the instructions comprise instructions to:

control one or more of the first solid-state switch, the first variable capacitance, and the third variable capacitance to tune a capacitance of the shunt leg; and control one or more of a second solid-state switch, the second variable capacitance, and a fourth variable capacitance to tune a capacitance of the series leg, wherein the fourth variable capacitance is part of the series leg and is switchably connectable in parallel with the second variable capacitance via the second solid-state switch.

14. The non-transitory processor-readable medium of claim 13, the instructions comprise instructions to:

determine a first target shunt capacitance value and a first target series capacitance value for impedance matching for the first power pulse;

determine a second target shunt capacitance value and a second target series capacitance value for impedance matching for the second power pulse;

control the first solid-state switch to switch between the first target shunt capacitance value and the second target shunt capacitance value; and control the second solid-state switch to switch between the first target series capacitance value and the second target series capacitance value.

15. The non-transitory processor-readable medium of claim 13, wherein:

the first variable capacitance, the second variable capacitance, the third variable capacitance, and the fourth variable capacitance each comprise a variable vacuum capacitance.

16. The non-transitory processor-readable medium of claim 12, wherein the instructions comprise instructions to:

during the first power pulse, disconnect the third variable capacitance, and control the first variable capacitance and the second variable capacitance to match a dynamic load impedance to a source impedance for the first power pulse; and during the second power pulse, connect the third variable capacitance, and control a sum of the first variable capacitance and the third variable capacitance for the impedance tuning for the second power pulse.

17. The non-transitory processor-readable medium of claim 16, wherein the instructions comprise instructions to:

perform frequency tuning during the second power pulse to complete the impedance tuning for the second power pulse.

* * * * *